United States Patent
Huang et al.

(10) Patent No.: US 8,994,637 B2
(45) Date of Patent: Mar. 31, 2015

(54) IMAGE DISPLAY SYSTEMS, SHIFT REGISTERS AND METHODS FOR CONTROLLING SHIFT REGISTER

(75) Inventors: Sheng-Feng Huang, Chu-Nan (TW); Shih-Chien Feng, Chu-Nan (TW); Ting-Yao Chu, Chu-Nan (TW)

(73) Assignees: Innocom Technology (Shenzhen) Co., Ltd., Shenzhen (CN); Innolux Corporation, Jhu-Nan (TW)

( * ) Notice: Subject to any disclaimer, the term of this patent is extended or adjusted under 35 U.S.C. 154(b) by 239 days.

(21) Appl. No.: 13/452,621

(22) Filed: Apr. 20, 2012

(65) Prior Publication Data
US 2012/0268432 A1 Oct. 25, 2012

(30) Foreign Application Priority Data
Apr. 25, 2011 (TW) .............. 100114229 A

(51) Int. Cl.
  *G09G 3/36* (2006.01)
  *G11C 19/28* (2006.01)
  *G09G 3/20* (2006.01)

(52) U.S. Cl.
  CPC .......... *G11C 19/28* (2013.01); *G09G 3/20* (2013.01); *G09G 2310/0286* (2013.01)
  USPC .................................................. 345/100

(58) Field of Classification Search
  CPC ................................................. G09G 3/3688
  USPC ............... 345/100, 98; 327/57, 241; 377/54
  See application file for complete search history.

(56) References Cited

U.S. PATENT DOCUMENTS

| | | | |
|---|---|---|---|
| 6,693,617 B2 * | 2/2004 | Sasaki et al. | 345/98 |
| 7,250,788 B2 * | 7/2007 | Lee et al. | 326/46 |
| 7,733,321 B2 * | 6/2010 | Hayashi et al. | 345/100 |
| 8,223,107 B2 * | 7/2012 | Nakamura | 345/100 |
| 2002/0149560 A1 * | 10/2002 | Puar et al. | 345/156 |
| 2003/0234761 A1 * | 12/2003 | Washio et al. | 345/100 |
| 2009/0121998 A1 * | 5/2009 | Ohkawa et al. | 345/100 |
| 2014/0022233 A1 * | 1/2014 | Cheng et al. | 345/212 |

FOREIGN PATENT DOCUMENTS

| | | |
|---|---|---|
| CN | 101587752 | 11/2009 |
| TW | 200305848 | 11/2003 |
| TW | I247314 | 1/2006 |
| TW | 201023516 | 6/2010 |
| TW | I329298 | 8/2010 |

* cited by examiner

*Primary Examiner* — Chanh Nguyen
*Assistant Examiner* — Roy Rabindranath
(74) *Attorney, Agent, or Firm* — Liu & Liu

(57) ABSTRACT

An image display system includes a gate driving circuit and a data driving circuit. The gate driving circuit generates gate driving signals to drive pixels in a pixel array. The data driving circuit generates data driving signals to provide data to the pixels. At least one of the gate and data driving circuits includes a shift register. The shift register includes flip-flops coupled in serial. Each flip-flop generates output signals in response to an input signal, and is reset in response to a reset signal. One of the flip-flops receives a first output signal of a last stage flip-flop as the reset signal thereof, and at least one flip-flop following the flip-flop receiving the first output signal of the last stage flip-flop receives a second output signal of the flip-flop receiving the first output signal of the last stage flip-flop as the reset signal thereof.

17 Claims, 16 Drawing Sheets

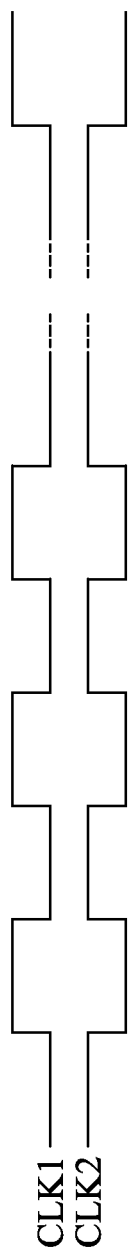

IMAGE DISPLAY SYSTEMS, SHIFT REGISTERS AND METHODS FOR CONTROLLING SHIFT REGISTER

CROSS REFERENCE TO RELATED APPLICATIONS

This Application claims priority of Taiwan Patent Application No. 100114229, filed on Apr. 25, 2011, the entirety of which is incorporated by reference herein.

BACKGROUND

1. Field of the Invention

The invention relates to a shift register, and more particularly to a shift register to realize prevention of malfunctions in the last stage flip-flop.

2. Description of the Related Art

Shift registers have been widely used in data driving circuits and gate driving circuits, for controlling timing in receiving data signals in each data line and for generating a scanning signal for each gate line, and the like. In a data driving circuit, a shift register outputs a selection signal so as to write an image signal into each data line. Meanwhile, in the gate driving circuit, the shift register outputs a scanning signal so as to sequentially write the image signal supplied to each data line into pixels in a pixel array.

FIG. 1 shows a conventional shift register. A pulse is shifted through the flip-flops in accordance with output signals of preceding flip-flops and feedback signals from following flip-flops. In other words, each output signal from the flip-flops is outputted as the set signal for the following flip-flop thereof, and inputted to the preceding flip-flop thereof as the reset signal for resetting the preceding flip-flop. Thus, the flip-flops that have outputted signals are reset as the pulse is shifted through the following flip-flops. Note that an output signal from a last-stage flip-flop F(N+1) is inputted to the preceding flip-flop F(N) and to itself as reset signals. Thus, it is necessary to stop (self-reset) operation of the last-stage flip-flop F(N+1) by using the output signal of itself. However, if there is some delay between the feedback signals of the flip-flops F(N+1) and F(N), the last-stage flip-flop F(N+1) would be reset (i.e. stopped) before the preceding flip-flop F(N), causing an abnormal output signal OUT(N) to be generated, such that the shift register malfunctions.

Therefore, a novel design of a shift register to realize prevention of malfunctions in the last stage flip-flop is highly required.

SUMMARY

Image display systems, shift registers and methods for controlling a shift register are provided. According to an embodiment of the invention, an image display system comprises a gate driving circuit and a data driving circuit. The gate driving circuit generates gate driving signals to drive pixels in a pixel array. The data driving circuit generates data driving signals to provide data to the pixels of the pixel array. At least one of the gate and data driving circuits comprises a shift register. The shift register comprises flip-flops coupled in serial. Each flip-flop generates output signals in response to an input signal, and is reset in response to a reset signal. One of the flip-flops receives a first output signal of a last stage flip-flop as the reset signal thereof, and at least one flip-flop following the flip-flop receiving the first output signal of the last stage flip-flop receives a second output signal of the flip-flop receiving the first output signal of the last stage flip-flop as the reset signal thereof.

According to another embodiment of the invention, a shift register comprises a plurality of flip-flops coupled in serial. Each flip-flop generates a plurality of output signals in response to an input signal, and is reset in response to a reset signal. An n-th stage flip-flop receives a first output signal of a last stage flip-flop as the reset signal thereof, and at least one flip-flop following the n-th stage flip-flop receives a second output signal of the n-th stage flip-flop as the reset signal thereof, wherein n is a positive integer.

According to yet another embodiment of the invention, a shift register controlling method, for controlling operations of a shift register comprising a plurality of flip-flops coupled in serial, each flip-flop generating at least a first output signal and a second output signal in response to an input signal and being reset in response to a reset signal, comprises: providing a start pulse to a first stage flip-flop as the input signal of the first stage flip-flop; providing the first output signal of a preceding flip-flop as the input signal of each flip-flop following the first stage flip-flop; providing the first output signal of a following flip-flop as the reset signal of each flip-flop preceding an n-th stage flip-flop, wherein n is a positive integer; providing the first output signal of a last stage flip-flop as the reset signal of the n-th stage flip-flop; and providing the second output signal of the n-th stage flip-flop as the reset signal of at least one flip-flop following the n-th stage flip-flop.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIG. 9b shows waveforms of the signals in the last two stage flip-flops based on the waveforms shown in FIG. 9a;

FIG. 10 shows waveforms of the clock signals according to another embodiment of the invention;

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
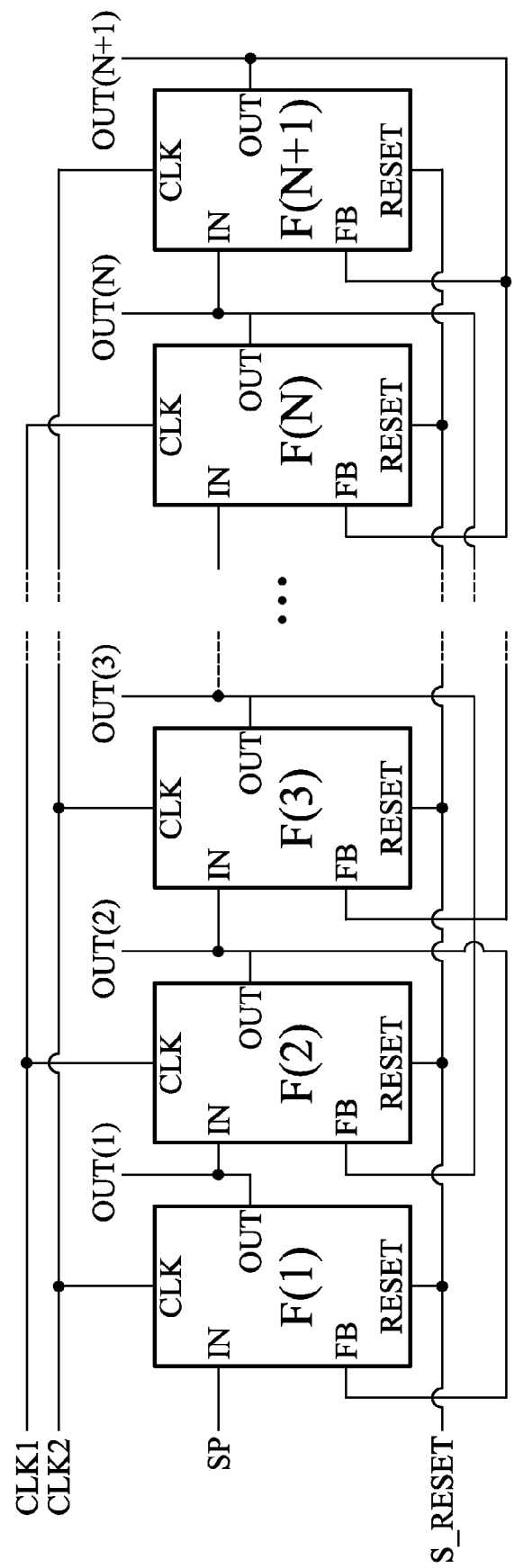
FIG. 1 shows a conventional shift register.
Figure 2:
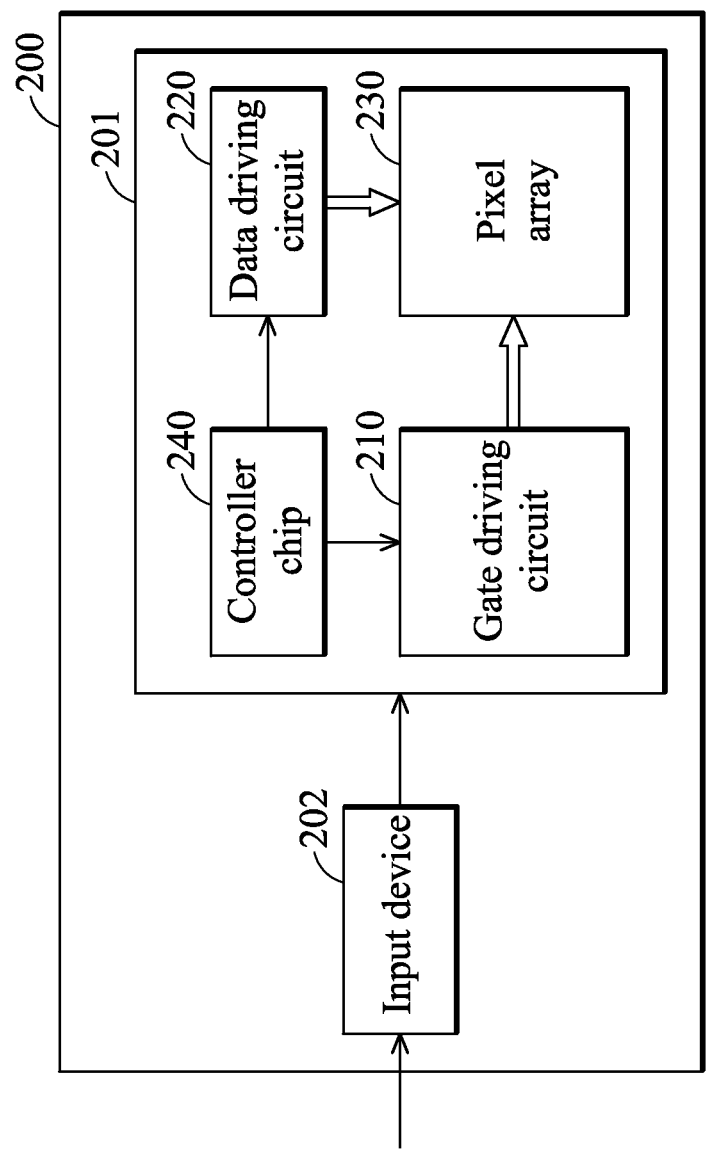
FIG. 2 shows one of the various types of image display systems of the invention according to an embodiment of the invention.

FIG. 2 shows one of the various types of image display systems of the invention according to an embodiment of the invention. As shown in FIG. 2, the image display system may comprise a display panel 201, where the display panel 201 may comprise a gate driving circuit 210, a data driving circuit 220, a pixel array 230 and a controller chip 240. The gate driving circuit 210 generates a plurality of gate driving signals to drive a plurality of pixels in the pixel array 230. The data driving circuit 220 generates a plurality of data driving signals to provide data driving signals to the pixels of the pixel array 230. The controller chip 240 generates a plurality of timing signals, comprising clock signals, a system reset signal S_RESET and a start pulse SP.

In addition, the image display system of the invention may further comprise an electronic device 200. The electronic device 200 may comprise the above-mentioned display panel 201 and an input device 202. The input device 202 receives image signals and controls the display panel 201 to display images. According to an embodiment of the invention, the electronic device 200 may be implemented as various devices, comprising: a mobile phone, a digital camera, a personal digital assistant (PDA), a lap-top computer, a personal computer, a television, a vehicle displayer, a portable DVD player, or any apparatus with image display functionality.

According to an embodiment, at least one of the gate driving circuit 210 and the data driving circuit 220 may comprise a shift register for sequentially outputting a selection signal (or called data driving signal) to each data line of the data driving circuit 220 so as to write an image signal into each data line, or sequentially generating a scanning signal (or called gate driving signal) to each gate line of the gate driving circuit 210 so as to sequentially write the image signal supplied to each data line into the pixels in a pixel array 230.

Figure 3:
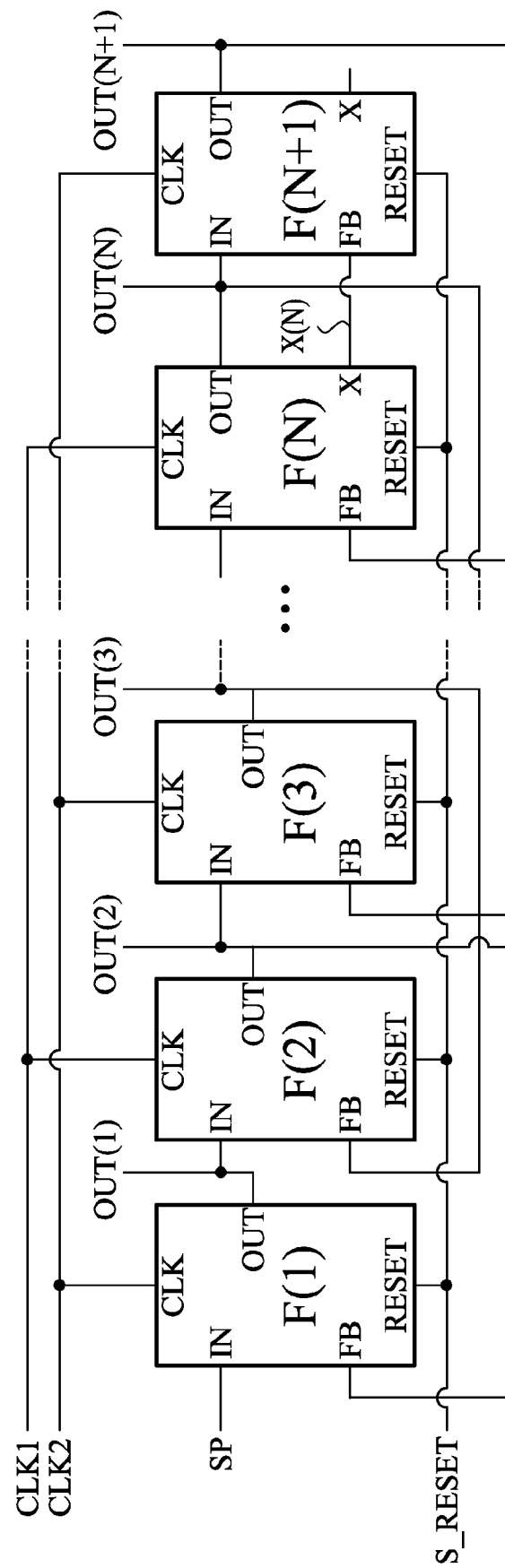
FIG. 3 shows a circuit diagram of a shift register according to an embodiment of the invention.

FIG. 3 shows a circuit diagram of a shift register according to an embodiment of the invention. As shown in FIG. 3, the shift register may comprise (N+1) stages of serially coupled flip-flops F(1), F(2), F(3) . . . and F(N+1), where N is a positive integer. Each flip-flop may comprise a signal input terminal IN, a clock input terminal CLK, a feedback terminal FB, a first signal output terminal OUT and a system reset signal input terminal RESET. Each flip-flop generates at least one output signal in response to an input signal received at the signal input terminal IN, and is reset in response to a reset signal received at the feedback terminal FB. In addition, each flip-flop further receives a system reset signal S_RESET for resetting the operations of the whole shift register.

Regarding the input signal of each flip-flop, a first stage flip-flop F(1) of the shift register receives the start pulse SP as the input signal thereof, and the remaining stage flip-flops F(2)~F(N+1) respectively receive the first output signal OUT(1)~OUT(N) of a preceding flip-flop (that is, the flip-flops F(1)~F(N)) as the input signal thereof.

Regarding the reset signal received at the feedback terminal FB of each flip-flop, according to an embodiment of the invention, the shift register may be designed so that one or more flip-flop(s) (for example, the flip-flops F(1)~F(n−1)) preceding an n-th stage flip-flop respectively receive(s) the first output signal (for example, the first output signals OUT(2)~OUT(n)) of a following flip-flop (for example, the flip-flops F(2)~F(n)) as the reset signal thereof, and the n-th stage flip-flop F(n) receives the first output signal OUT(N+1) of a last stage flip-flop F(N+1) as the reset signal thereof, where n is a positive integer and $0 \leq n \leq (N+1)$. In other words, the n-th stage flip-flop F(n) is reset in response to the first output signal OUT(N+1) of the last stage flip-flop F(N+1).

In addition, according to an embodiment of the invention, to make sure that the flip-flops F(1), F(2), F(3) . . . and F(N+1) can be sequentially reset, a second signal output terminal X of the n-th stage flip-flop F(n) is utilized for outputting a second output signal X(n) to at least one feedback terminal of a corresponding flip-flop as the reset signal thereof.

Take the shift register shown in FIG. 3 as an example, the feedback terminals FB of the flip-flops F(1)~F(N) respectively receive the first output signal (for example, OUT(2)~OUT(N+1)) of a following flip-flop (for example, the flip-flops F(2)~F(N+1)) as the reset signal thereof, and the feedback terminal FB of the last stage flip-flop F(N+1) receives the second output signal X(N) of the N-th stage flip-flop F(N) as the reset signal thereof.

Figure 4:
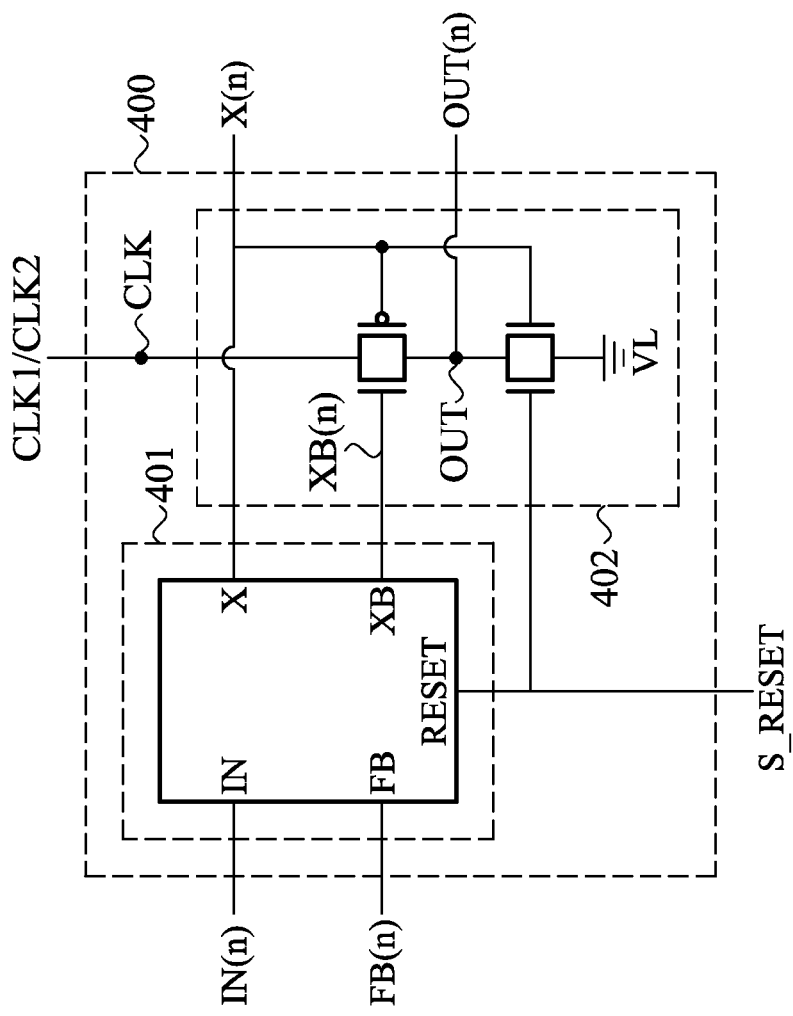
FIG. 4 shows a circuit diagram of a flip-flop according to an embodiment of the invention.

FIG. 4 shows a circuit diagram of a flip-flop according to an embodiment of the invention. As shown in FIG. 4, the flip-flop 400 may comprise a latch circuit 401 and a switch circuit 402. The latch circuit 401 receives the input signal IN(n) and the reset signal FB(n), and generates the second output signal X(n) and an inverse of the second output signal XB(n) of the flip-flop according to the input signal IN(n) and the reset signal FB(n). The switch circuit 402 receives the clock signal CLK1/CLK2, the system reset signal S_RESET, the second output signal X(n) and the inverse of the second output signal XB(n), and switches in accordance with the levels of the above-mentioned signals so as to selectively output the clock signal CLK1/CLK2 or a low voltage signal VL as the first output signal OUT(n) of the flip-flop. The first output signal OUT(n) may be the data driving signal of the data driving circuit or the gate driving signal of the gate driving circuit.

Figure 5:
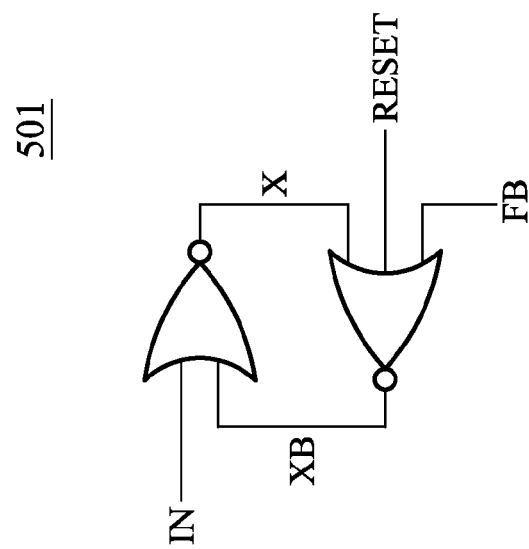
FIG. 5 shows a circuit diagram of a latch circuit according to an embodiment of the invention.

FIG. 5 shows a circuit diagram of a latch circuit according to an embodiment of the invention. As shown in FIG. 5, the latch circuit 501 may comprise a plurality of NOR gates. The first NOR gate is coupled to the signal input terminal IN and the third signal output terminal XB for outputting the inverse of the second output signal XB(n), and the second NOR gate is coupled to the feedback terminal FB and the second signal output terminal X for outputting the second output signal X(n). The latch circuit 501 may generate the second output signal X(n) and the inverse of the second output signal XB(n)

according to a result of performing logic operation(s) on the input signal IN(n) and the reset signal FB(n). Note that according to an embodiment of the invention, the first output signal OUT(n) is also a result obtained by performing logic operation(s) on the second output signal X(n) and the clock signal CLK1/CLK2.

Figure 6A:
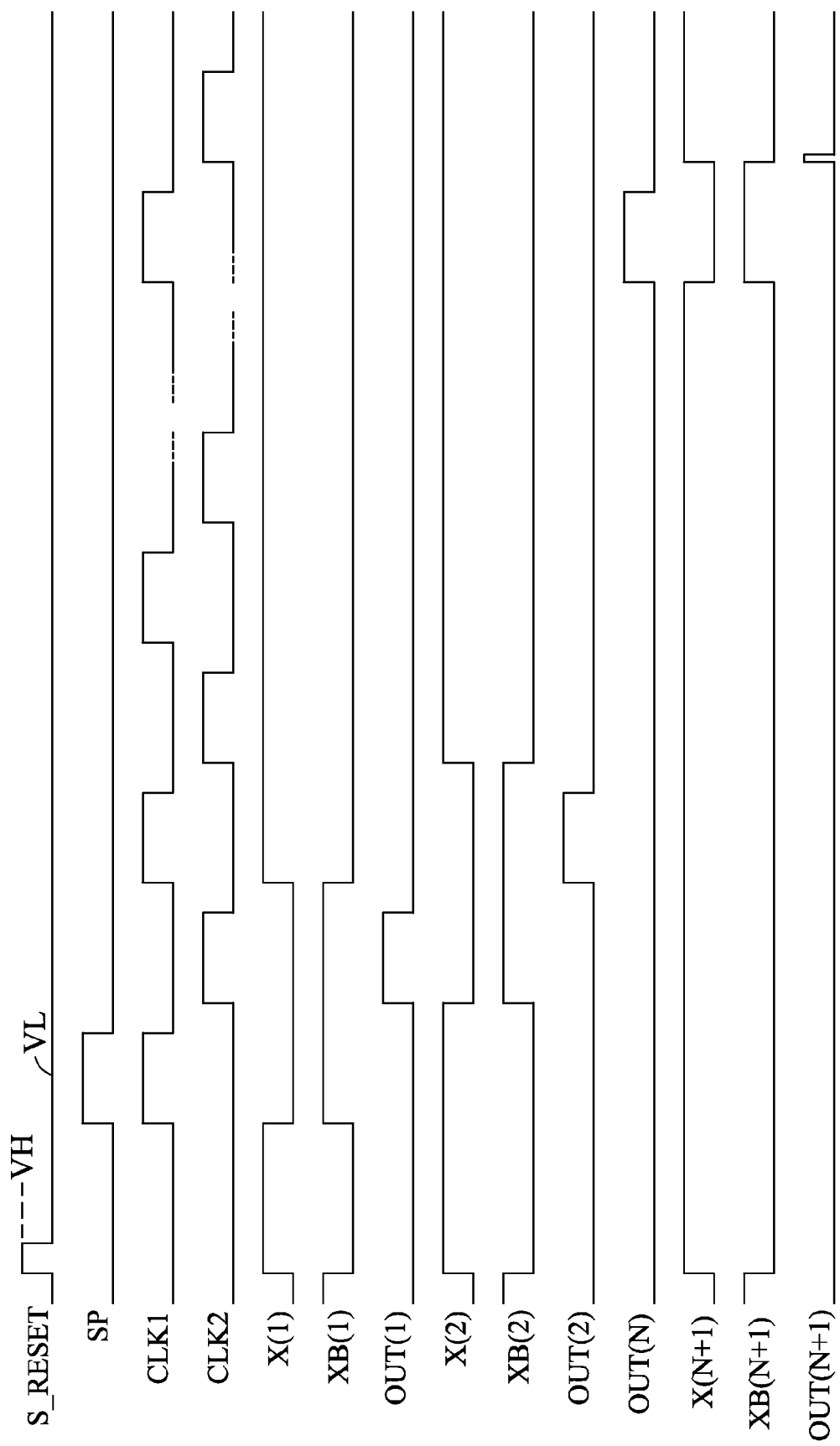
FIG. 6a shows the waveforms of multiple signals according to an embodiment of the invention.

FIG. 6a shows waveforms of multiple signals according to an embodiment of the invention. As shown in FIG. 6a, the system reset signal S_RESET is first pulled high to a voltage level of the high voltage signal VH so as to reset the operations of the whole shift register. The clock signal CLK1 is supplied to the even stage flip-flops and the clock signal CLK2 is supplied to the odd stage flip-flops. According to the waveforms of the signals in the first stage flip-flop, when the second output signal X(1) has a low voltage level, the clock signal CLK2 is coupled to the first signal output terminal OUT and therefore, the first stage flip-flop generates the first output signal OUT(1) according to the clock signal CLK2. When the first output signal OUT(2) of the second stage flip-flop is generated and fed back to the feedback terminal FB of the first stage flip-flop, the second output signal X(1) of the first stage flip-flop is reset to have a high voltage level, so that the low voltage signal VL is coupled to the first signal output terminal OUT and therefore, the first stage flip-flop generates the first output signal OUT(1) according to the low voltage signal VL.

Figure 6B:
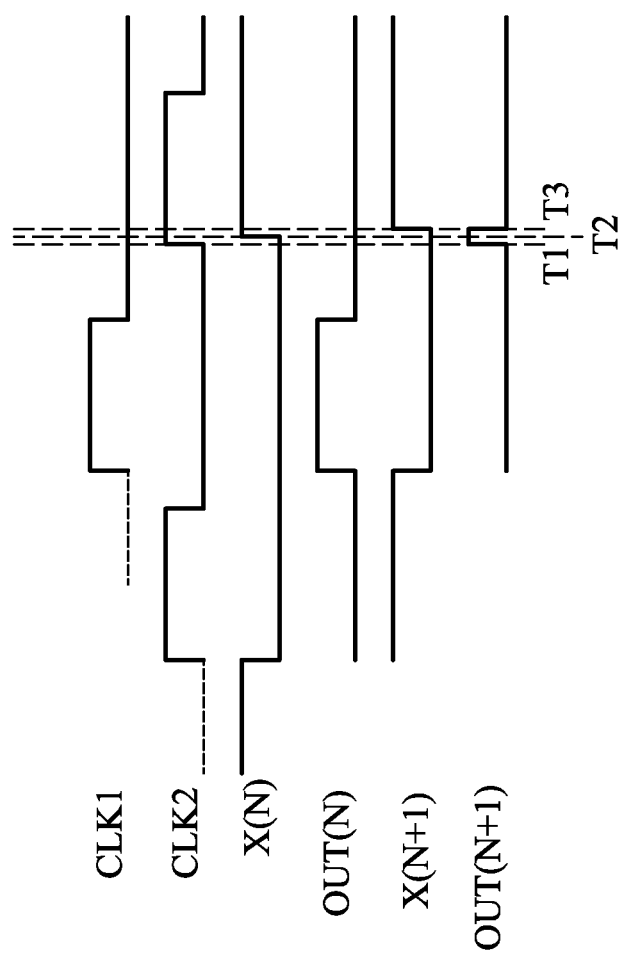
FIG. 6b shows the waveforms of the signals in the last two stage flip-flops according to an embodiment of the invention.

FIG. 6b shows waveforms of the signals in the last two stage flip-flops according to an embodiment of the invention. As shown in FIG. 6b, the first output signal OUT(N+1) of the last stage flip-flop F(N+1) is pulled high at time T1. In response to the rising of the first output signal OUT(N+1), the flip-flop F(N) is reset. Therefore, the second output signal X(N) of the flip-flop F(N) is pulled high at time T2, where the timing offset between the time T1 and T2 is due to the inherent circuit delay. After that, because the last stage flip-flop F(N+1) receives the second output signal X(N) as the reset signal, the second output signal X(N+1) of the last stage flip-flop F(N+1) is pulled high at time T3 in response to the rising of the second output signal X(N), where the timing offset between the time T2 and T3 is due to the inherent circuit delay. Finally, in response to the rising of the second output signal X(N+1), the first output signal OUT(N+1) is pulled low so that the last stage flip-flop F(N+1) is reset. In this manner, it is ensured that the last stage flip-flop F(N+1) is reset after the flip-flop F(N) is reset, realizing prevention of malfunctions in the last stage flip-flop.

Figure 8:
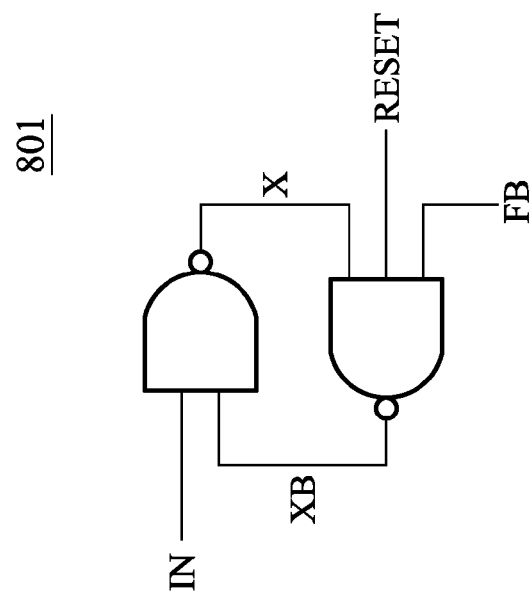
FIG. 8 shows a circuit diagram of a latch circuit that can be applied in the flip-flop shown in FIG. 7 according to another embodiment of the invention.
Figure 7:
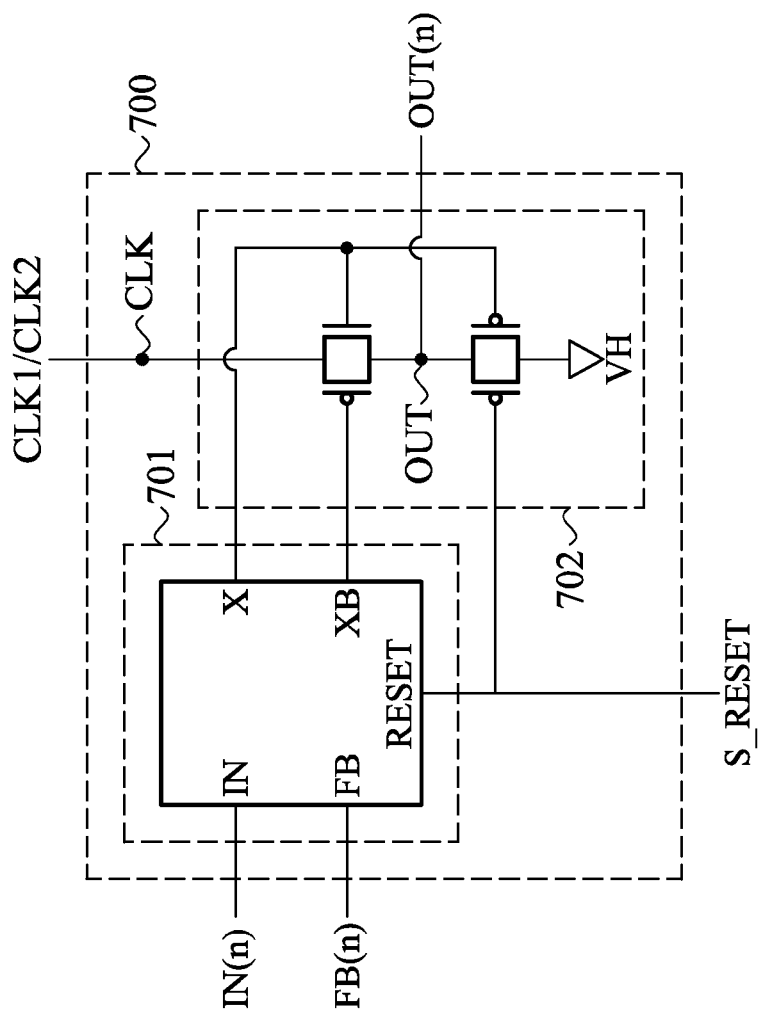
FIG. 7 shows a circuit diagram of a flip-flop according to another embodiment of the invention.

Note that the latch circuit should not be limited to be implemented by the NOR gates shown in FIG. 5. FIG. 7 shows a circuit diagram of a flip-flop according to another embodiment of the invention. As shown in FIG. 7, operations of the flip-flop 700 are similar to that of the flip-flop 400, and the differences are that the latch circuit 701 and the switch circuit 702 are implemented by the devices complementary to those in the latch circuit 401 and the switch circuit 402. FIG. 8 shows a circuit diagram of a latch circuit that can be applied in the flip-flop 700 shown in FIG. 7 according to another embodiment of the invention. As shown in FIG. 8, the latch circuit 801 comprises a plurality of NAND gates for generating the second output signal X(n) and the inverse of the second output signal XB(n) according to a result of performing logic operation(s) on the input signal IN(n) and the reset signal FB(n).

Figure 9A:
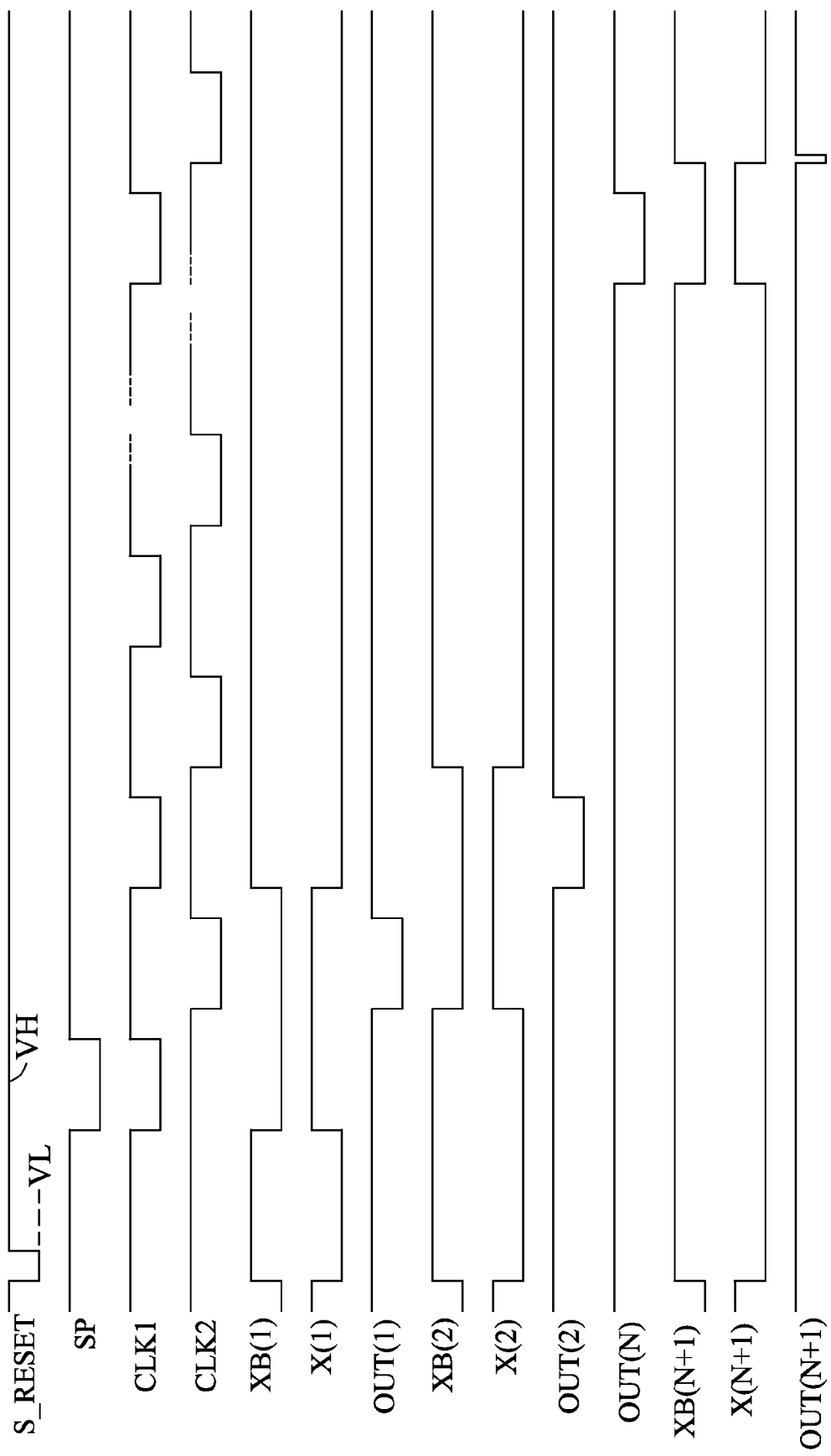
FIG. 9a shows waveforms of multiple signals generated based on the flip-flop shown in FIG. 7 and the latch circuit shown in FIG. 8.

FIG. 9a shows waveforms of multiple signals generated based on the flip-flop shown in FIG. 7 and the latch circuit shown in FIG. 8. Note that the waveforms shown in FIG. 9 are similar to the waveforms shown in FIG. 6, and the differences are that the phases of the system reset signal S_RESET, the start pulse SP, the clock signal CLK1 and CLK2 and the first output signal OUT(1)~OUT(N+1) are inverse to those shown in FIG. 6. Therefore, for the detailed descriptions, reference may be made to FIG. 6 and are omitted here for brevity.

Figure 9B:
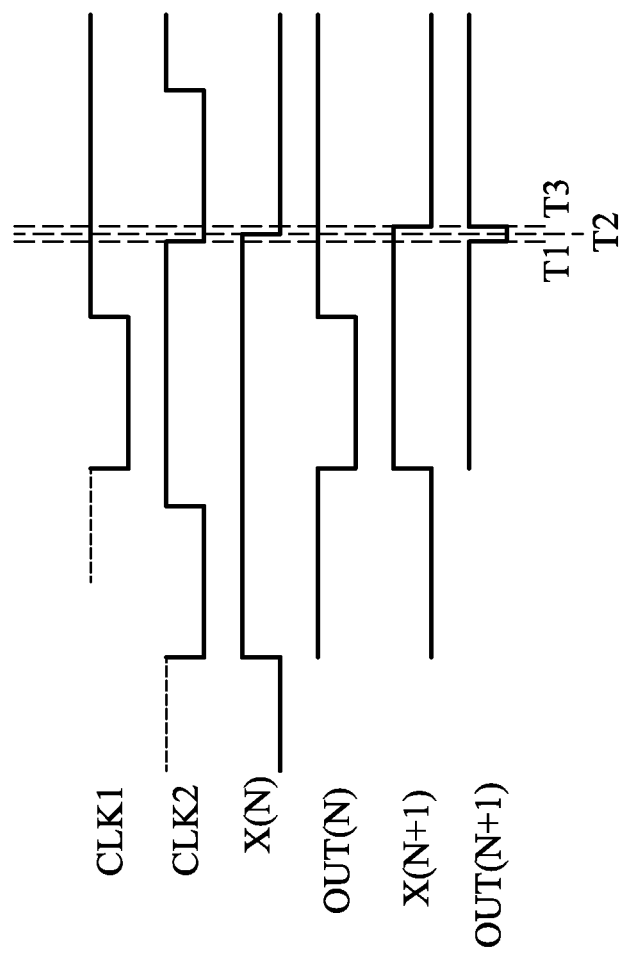

FIG. 9b shows waveforms of the signals in the last two stage flip-flops based on the waveforms shown in FIG. 9a. As shown in FIG. 9b, the first output signal OUT(N+1) of the last stage flip-flop is pulled low at time T1. In response to the falling of the first output signal OUT(N+1), the flip-flop F(N) is reset. Therefore, the second output signal X(N) of the flip-flop F(N) is pulled low at time T2, where the timing offset between the time T1 and T2 is due to the inherent circuit delay. After that, because the last stage flip-flop F(N+1) receives the second output signal X(N) as the reset signal, the second output signal X(N+1) of the last stage flip-flop F(N+1) is pulled low at time T3 in response to the falling of the second output signal X(N), where the timing offset between the time T2 and T3 is due to the inherent circuit delay. Finally, in response to the falling of the second output signal X(N+1), the first output signal OUT(N+1) is pulled high so that the last stage flip-flop F(N+1) is reset. In this manner, it is ensured that the last stage flip-flop F(N+1) is reset after the flip-flop F(N) is reset, realizing prevention of malfunctions in the last stage flip-flop.

In addition, it is noted that the waveforms of the clock signals should not be limited to the waveforms of the clock signals CLK1 and CLK2 as shown in FIG. 6a and FIG. 9a. For example, for the clock signals having complementary waveforms, such as the clock signals CLK1 and CLK2 shown in FIG. 10, may also be applicable.

Figure 11:
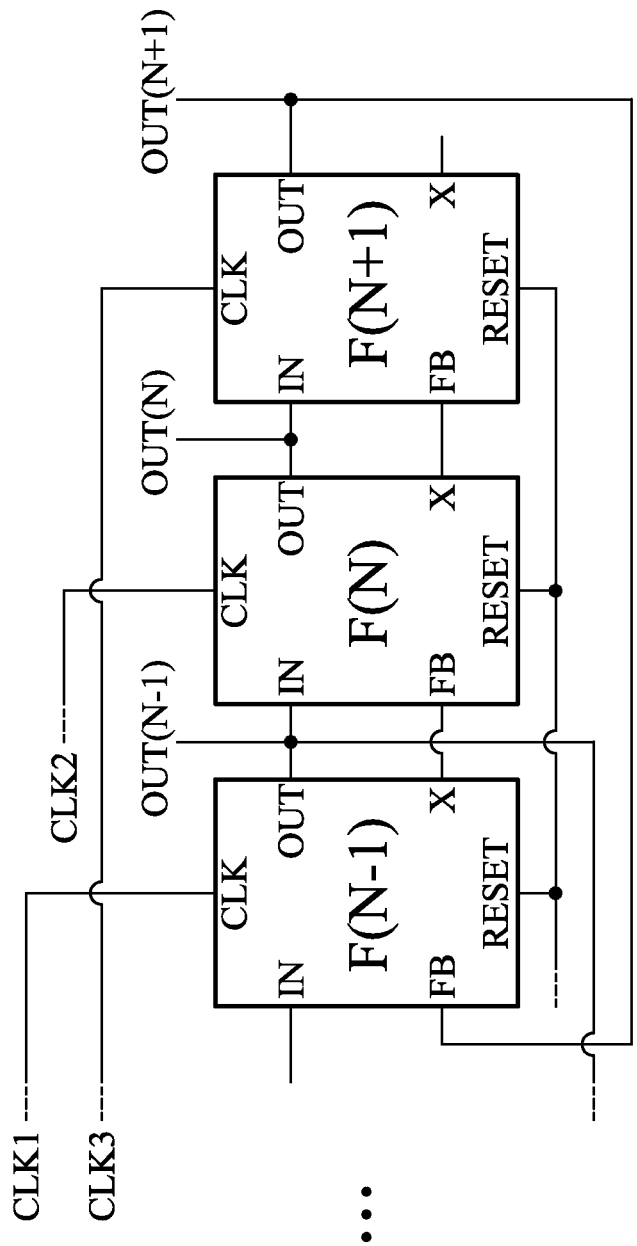
FIG. 11 shows a circuit diagram of a shift register receiving three clock signals according to another embodiment of the invention.
Figure 12:
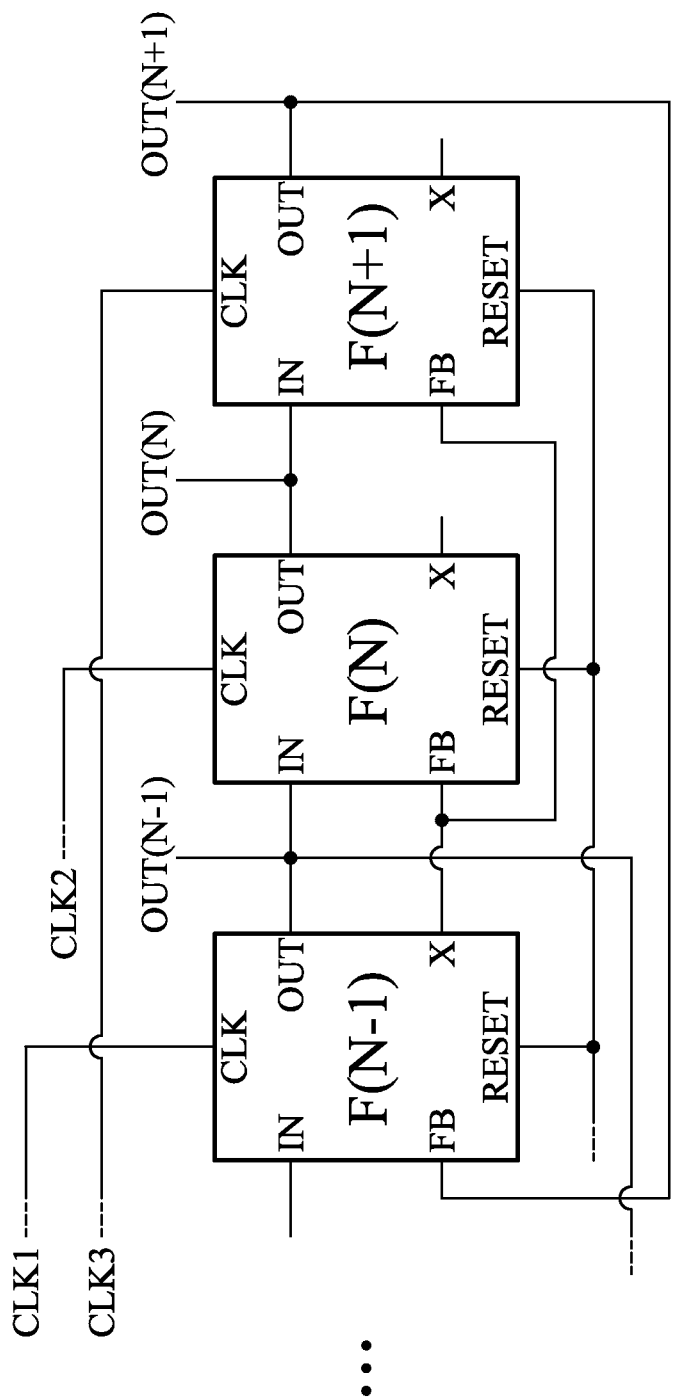
FIG. 12 shows a circuit diagram of a shift register receiving three clock signals according to yet another embodiment of the invention.

In addition, according to other embodiments of the invention, the invention concept may also be applicable for the shift register receiving more than two clock signals. FIG. 11 and FIG. 12 respectively show the circuit diagram of a shift register receiving three clock signals according another embodiment of the invention. To highlight the characteristics, FIG. 11 and FIG. 12 respectively show only the last three stage flip-flops receiving different clock signals. One of the ordinary skills in the art will readily appreciate that the structures in the remaining stage flip-flops can be easily deduced from the circuit diagrams of the shift register shown in FIG. 3, FIG. 11 and FIG. 12, thus, the corresponding descriptions thereof, and details of the remaining stage flip-flops are omitted here for brevity.

As shown in FIG. 11, the (N−1)-th to (N+1)-th stage flip-flops F(N−1)~F(N+1) respectively receive the clock signals CLK1, CLK2 and CLK3. The feedback terminal FB of the (N−1)-th stage flip-flop F(N−1) receives the first output signal OUT(N+1) of the (N+1)-th stage flip-flop F(N+1) as the reset signal. The feedback terminal FB of the N-th stage flip-flop F(N) receives the second output signal X(N−1) of the (N−1)-th stage flip-flop F(N−1) as the reset signal, and the feedback terminal FB of the (N+1)-th stage flip-flop F(N+1) receives the second output signal X(N) of the N-th stage flip-flop F(N) as the reset signal.

FIG. 12 shows a circuit diagram of a shift register receiving three clock signals according to another embodiment of the invention. As shown in FIG. 12, the (N−1)-th stage flip-flop F(N−1) receives the first output signal OUT(N+1) of the (N+1)-th stage flip-flop F(N+1) as the reset signal. The N-th stage flip-flop F(N) and the (N+1)-th stage flip-flop F(N+1) receive the second output signal X(N−1) of the (N−1)-th stage flip-flop F(N−1) as the reset signal.

Figure 13:
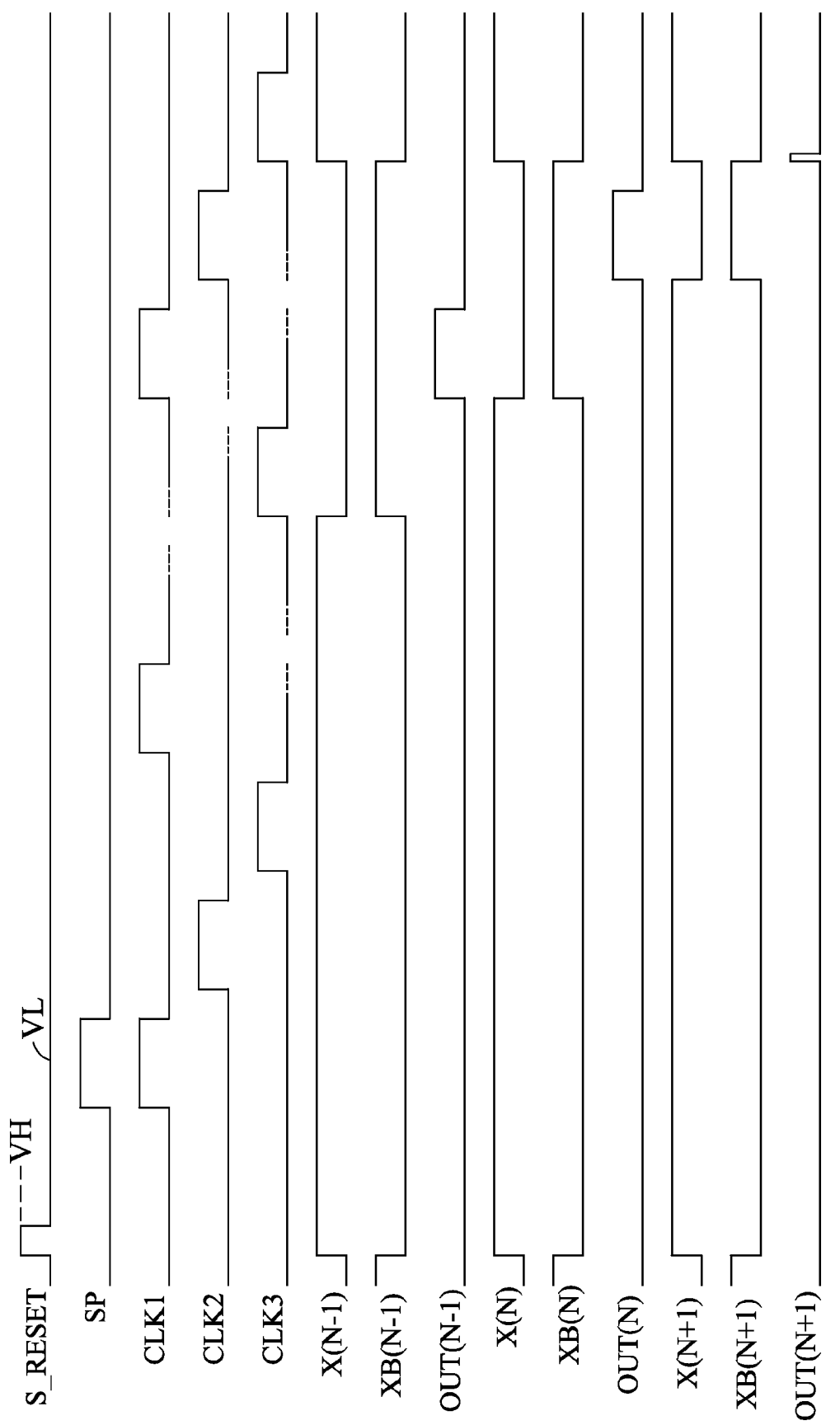
FIG. 13 shows waveforms of the signals generated by the shift registers shown in FIG. 11 and FIG. 12.

FIG. 13 shows waveforms of the signals generated by the shift registers shown in FIG. 11 and FIG. 12. As shown in FIG. 13, via the coupling method as illustrated above, the flip-flops F(N−1), F(N) and F(N+1) can be reset in order, realizing prevention of malfunctions of the shift register.

Similarly, the above-mentioned invention concept may also be applicable for the shift register receiving more than three clock signals. FIG. 14(a), FIG. 14(b), FIG. 14(c) and FIG. 14(d) respectively show a circuit diagram of a shift register receiving four clock signals according to another embodiment of the invention. To highlight the characteristics, FIG. 14(a)~FIG. 14(d) respectively show only the last four stage flip-flop receiving different clock signals. One of the ordinary skills in the art will readily appreciate that the structures in the remaining stage flip-flops can be easily deduced from the circuit diagram of the shift register shown in FIG. 3, FIG. 14(a)~FIG. 14(d), thus, the corresponding descriptions thereof, and details of the remaining stage flip-flops are omitted here for brevity.

Figure 14A:
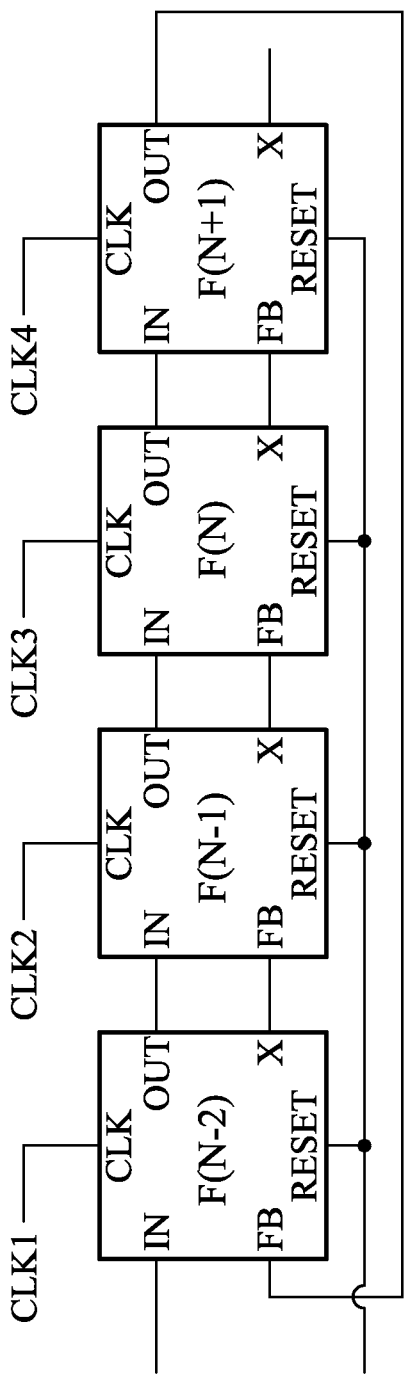
FIG. 14(a) shows a circuit diagram of a shift register receiving four clock signals according to another embodiment of the invention.

As shown in FIG. 14(a), the (N−2)-th to (N+1)-th stage flip-flops F(N−2)~F(N+1) respectively receive the clock signals CLK1, CLK2, CLK3 and CLK4. The (N−2)-th stage flip-flop F(N−2) receives the first output signal OUT(N+1) of the (N+1)-th stage flip-flop F(N+1) as the reset signal, and the flip-flops F(N−1)~F(N+1) following the (N−2)-th stage flip-flop F(N−2) respectively receive the second output signals X(N−2)~X(N) of the preceding flip-flop F(N−2)~F(N) as the reset signal.

Figure 14B:
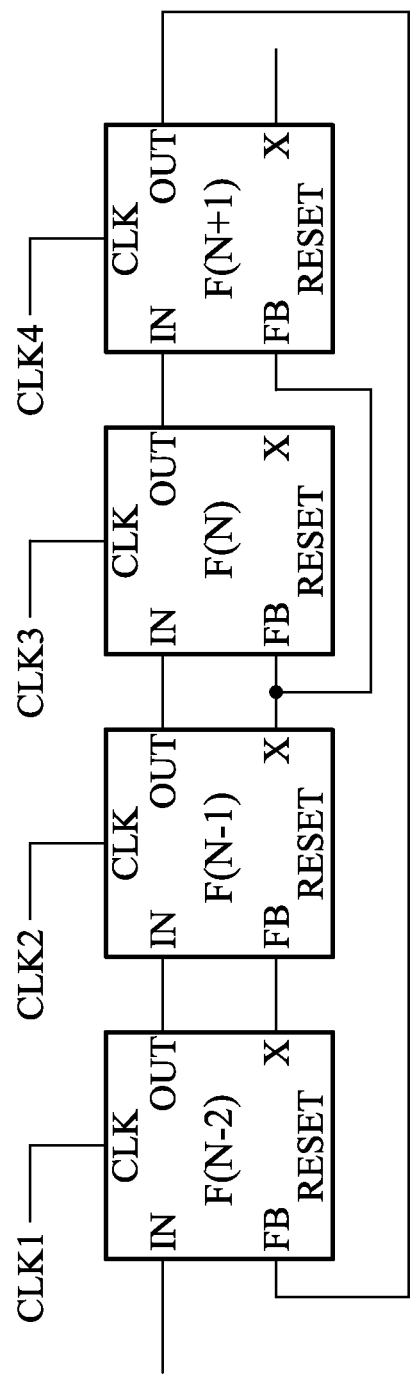
FIG. 14(b) shows a circuit diagram of a shift register receiving four clock signals according to yet another embodiment of the invention.

As shown in FIG. 14(b), the (N−2)-th stage flip-flop F(N−2) receives the first output signal OUT(N+1) of the (N+1)-th stage flip-flop F(N+1) as the reset signal, the (N−1)-th stage flip-flop F(N−1) receives the second output signal X(N−2) of the (N−2)-th stage flip-flop F(N−2) as the reset signal, and the N-th and (N+1)-th stage flip-flops F(N) and F(N+1) both receive the second output signal X(N−1) of the (N−1)-th stage flip-flop F(N−1) as the reset signal.

Figure 14C:
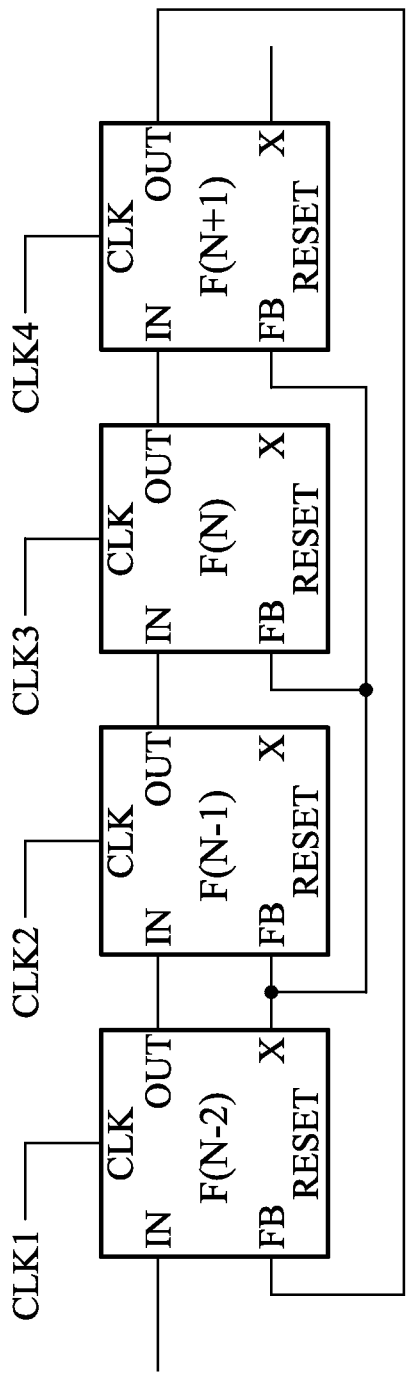
FIG. 14(c) shows a circuit diagram of a shift register receiving four clock signals according to yet another embodiment of the invention.

As shown in FIG. 14(c), the (N−2)-th stage flip-flop F(N−2) receives the first output signal OUT(N+1) of the (N+1)-th stage flip-flop F(N+1) as the reset signal, and the (N−1)-th, N-th and (N+1)-th stage flip-flops F(N−1), F(N) and F(N+1) all receive the second output signal X(N−2) of the (N−2)-th stage flip-flop F(N−2) as the reset signal.

Figure 14D:
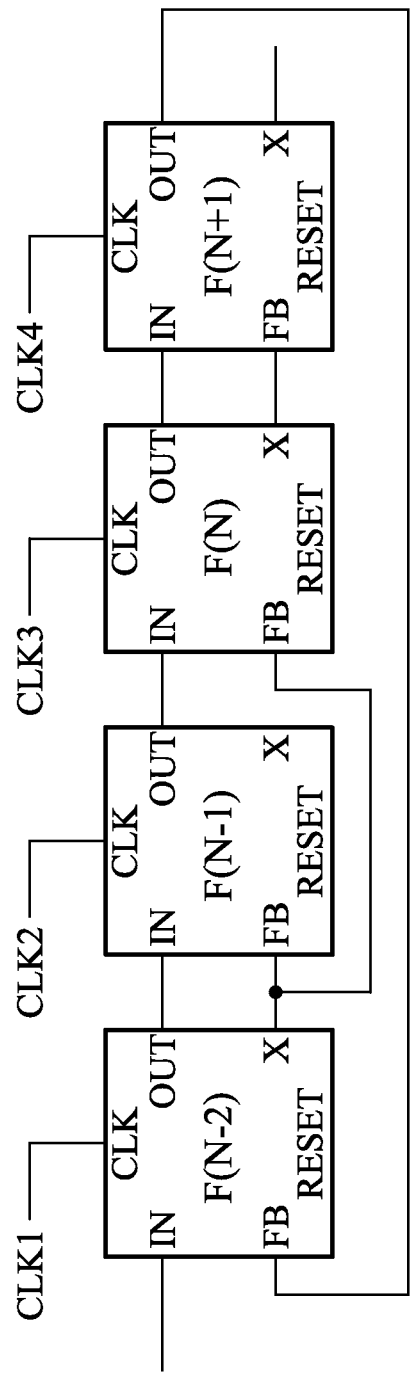
FIG. 14(d) shows a circuit diagram of a shift register receiving four clock signals according to yet another embodiment of the invention.

As shown in FIG. 14(d), the (N−2)-th stage flip-flop F(N−2) receives the first output signal OUT(N+1) of the (N+1)-th stage flip-flop F(N+1) as the reset signal, the (N−1)-th and N-th stage flip-flops F(N−1) and F(N) both receive the second output signal X(N−2) of the (N−2)-th stage flip-flop F(N−2) as the reset signal, and the (N+1)-th stage flip-flop F(N+1) receives the second output signal X(N) of the N-th stage flip-flop F(N) as the reset signal.

Via the coupling method as illustrated above, the flip-flops F(N−2), F(N−1), F(N) and F(N+1) can be reset in order, realizing prevention of malfunctions of the shift register.

Figure 15:
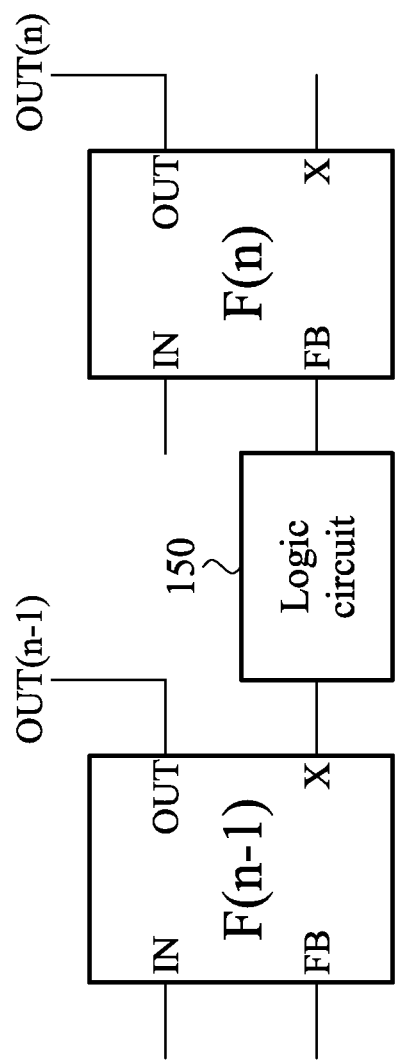
FIG. 15 shows a circuit diagram of a shift register according to yet another embodiment of the invention.

FIG. 15 shows a circuit diagram of a shift register according to yet another embodiment of the invention. In this embodiment, the shift register may further comprise a logic circuit 150 coupled to at least one feedback terminal FB of a corresponding flip-flop for delaying the reset signal of the corresponding flip-flop. As shown in FIG. 15, the logic circuit 150 is coupled between the second signal output terminal X of the flip-flop F(n−1) and the feedback terminal FB of the flip-flop F(n) so as to provide a delay. In the embodiments, the logic circuit 150 may be implemented by multiple devices that can provide a predetermined amount of delay. For example, one or more delay unit(s), inverter(s), NAND gate(s), NOR gate(s), flip-flop(s), or others.

Based on the invention concept, a shift register controlling method for controlling operations of a shift register comprising a plurality of flip-flops coupled in serial is further provided. Each flip-flop generates at least a first output signal and a second output signal in response to an input signal and is reset in response to a reset signal. The method comprises: providing a start pulse to a first stage flip-flop as the input signal of the first stage flip-flop; providing the first output signal of a preceding flip-flop as the input signal of each flip-flop following the first stage flip-flop; providing the first output signal of a following flip-flop as the reset signal of each flip-flop preceding an n-th stage flip-flop, where n is a positive integer; providing the first output signal of a last stage flip-flop as the reset signal of the n-th stage flip-flop; and providing the second output signal of the n-th stage flip-flop as the reset signal of at least one flip-flop following the n-th stage flip-flop.

As to the reset operations of the remaining flip-flop(s) following the n-th stage flip-flop, according to an embodiment of the invention, the remaining flip-flop(s) following the n-th stage flip-flop may respectively receive the second output signal of a preceding flip-flop as the reset signal (as shown in FIG. 14(a)). Or, according to another embodiment of the invention, the remaining flip-flop(s) following the n-th stage flip-flop may all receive the second output signal of a predetermined stage flip-flop as the reset signal (as shown in FIG. 14(b)~FIG. 14(d))

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. An image display system, comprising:
a gate driving circuit, generating a plurality of gate driving signals to drive a plurality of pixels in a pixel array; and
a data driving circuit, generating a plurality of data driving signals to provide data to the pixels of the pixel array,
wherein at least one of the gate driving circuit and the data driving circuit comprises:
a shift register, comprising a plurality of flip-flops coupled in serial, wherein each flip-flop generates a plurality of output signals in response to an input signal, and is reset in response to a reset signal, wherein one of the flip-flops receives a first output signal of a last stage flip-flop as the reset signal thereof, and at least one flip-flop following the flip-flop receiving the first output signal of the last stage flip-flop receives a second output signal of the flip-flop receiving the first output signal of the last stage flip-flop as the reset signal thereof, and wherein more than one flip-flop following the flip-flop receiving the first output signal of the last stage flip-flop as the reset signal receive the second output signal of a same stage flip-flop as the reset signal thereof.

2. The image display system as claimed in claim 1, further comprising a display panel, wherein the display panel comprises:
the gate driving circuit;
the data driving circuit;
the pixel array; and
a controller chip, for generating a start pulse,
wherein a first stage flip-flop of the shift register receives the start pulse as the input signal thereof, and each flip-flop following the first stage flip-flop receives the first output signal of a preceding flip-flop as the input signal thereof, and one or more flip-flop(s) preceding the flip-flop receiving the first output signal of the last stage flip-flop as the reset signal receive(s) the first output signal of a following flip-flop as the reset signal thereof.

3. The image display system as claimed in claim 1, wherein one or more flip-flop(s) following the flip-flop receiving the first output signal of the last stage flip-flop as the reset signal receive(s) the second output signal of a preceding flip-flop as the reset signal thereof.

4. The image display system as claimed in claim 1, further comprising:
a logic circuit, coupled to at least one feedback terminal, at which the reset signal of the corresponding flip-flop is received, and delaying the reset signal of the corresponding flip-flop.

5. The image display system as claimed in claim 1, wherein at least one of the flip-flops comprises:
a latch circuit, receiving the input signal and the reset signal, and generating the second output signal of the flip-flop according to the input signal and the reset signal; and
a switch circuit, receiving a clock signal and outputting the clock signal as the first output signal of the flip-flop according to a level of the second output signal.

6. The image display system claimed in claim 5, wherein the latch circuit comprises a plurality of logic gates for generating the second output signal according to a result of performing logic operation(s) on the input signal and the reset signal.

7. A shift register, comprising:
a plurality of flip-flops coupled in serial, wherein each flip-flop generates a plurality of output signals in response to an input signal, and is reset in response to a reset signal,
wherein an n-th stage flip-flop receives a first output signal of a last stage flip-flop as the reset signal thereof, and at least one flip-flop following the n-th stage flip-flop receives a second output signal of the n-th stage flip-flop as the reset signal thereof, wherein n is a positive integer, and wherein more than one flip-flop following the n-th stage flip-flop receive the second output signal of a same stage flip-flop as the reset signal thereof.

8. The shift register as claimed in claim 7, wherein the first stage flip-flop receives a start pulse as the input signal thereof, and each flip-flop following the first stage flip-flop receives the first output signal of a preceding flip-flop as the input signal thereof, and one or more flip-flop(s) preceding the n-th stage flip-flop receive(s) the first output signal of a following flip-flop as the reset signal thereof.

9. The shift register as claimed in claim 7, wherein one or more flip-flop(s) following the n-th stage flip-flop receive(s) the second output signal of a preceding flip-flop as the reset signal thereof.

10. The shift register as claimed in claim 7, further comprising:

a logic circuit, coupled to at least one feedback terminal, at which the reset signal of the corresponding flip-flop is received, and delaying the reset signal of the corresponding flip-flop.

11. The shift register as claimed in claim 7, wherein at least one of the flip-flops comprises:
a latch circuit, receiving the input signal and the reset signal, and generating the second output signal of the flip-flop according to the input signal and the reset signal; and
a switch circuit, receiving a clock signal and outputting the clock signal as the first output signal of the flip-flop according to a level of the second output signal.

12. The shift register as claimed in claim 11, wherein the latch circuit comprises a plurality of logic gates for generating the second output signal according to a result of performing logic operation(s) on the input signal and the reset signal.

13. The shift register as claimed in claim 11, wherein the first output signal is a result of performing logic operation(s) on the second output signal and the clock signal.

14. A shift register controlling method for controlling operations of a shift register comprising a plurality of flip-flops coupled in serial, wherein each flip-flop generates at least a first output signal and a second output signal in response to an input signal and is reset in response to a reset signal, the method comprises:
providing a start pulse to a first stage flip-flop as the input signal of the first stage flip-flop;
providing the first output signal of a preceding flip-flop as the input signal of each flip-flop following the first stage flip-flop;
providing the first output signal of a following flip-flop as the reset signal of each flip-flop preceding an n-th stage flip-flop, wherein n is a positive integer;
providing the first output signal of a last stage flip-flop as the reset signal of the n-th stage flip-flop;
providing the second output signal of the n-th stage flip-flop as the reset signal of at least one flip-flop following the n-th stage flip-flop; and
providing the second output signal of a same stage flip-flop as the reset signal of more than one flip-flop following the n-th stage flip-flop.

15. The method as claimed in claim 14, wherein the first output signal of each flip-flop is a result of performing logic operation(s) on the second output signal of the flip-flop and a clock signal.

16. The method as claimed in claim 14, further comprising:
providing the second output signal of a preceding flip-flop as the reset signal of one or more flip-flop(s) following the n-th stage flip-flop.

17. The method as claimed in claim 14, further comprising:
delaying at least one reset signal of the flip-flops.

* * * * *